(12) United States Patent
Dong et al.

(10) Patent No.: US 9,312,840 B2
(45) Date of Patent: Apr. 12, 2016

(54) LC LATTICE DELAY LINE FOR HIGH-SPEED ADC APPLICATIONS

(71) Applicant: ANALOG DEVICES TECHNOLOGY, Hamilton (BM)

(72) Inventors: Yunzhi Dong, Toronto (CA); Zhao Li, Toronto (CA); Richard E. Schreier, Toronto (CA); Hajime Shibata, Toronto (CA); Trevor Clifford Caldwell, Toronto (CA)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 14/194,107

(22) Filed: Feb. 28, 2014

(65) Prior Publication Data
US 2015/0249445 A1    Sep. 3, 2015

(51) Int. Cl.
*H03M 1/38* (2006.01)
*H03K 5/159* (2006.01)
(Continued)

(52) U.S. Cl.
CPC ............ *H03K 5/159* (2013.01); *H03M 1/0626* (2013.01); *H03M 1/14* (2013.01); *H03M 1/145* (2013.01); *H03M 1/38* (2013.01); *H03M 3/464* (2013.01)

(58) Field of Classification Search
CPC ....... H03M 1/12; H03M 1/44; H03M 1/0626; H03M 3/38; H03M 3/344; H03M 1/0629; H03M 1/0682; H03M 1/124; H03M 1/164
USPC .................. 341/118–121, 155, 156, 161, 162
See application file for complete search history.

(56) References Cited

U.S. PATENT DOCUMENTS

| 701,552 A | 6/1924 | Zobel |
| 792,523 A | 3/1927 | Zobel |

(Continued)

FOREIGN PATENT DOCUMENTS

| EP | 2779464 | 9/2014 |
| KR | 10-2012-0054087 | 5/2012 |

(Continued)

OTHER PUBLICATIONS

W. Kester, Data Conversion Handbook 3rd edition, Chapter 3, Section 3.2, Analog Devices, Inc. ISBN—10:0750678410, 2004, 142 pages.

(Continued)

*Primary Examiner* — Linh Nguyen
(74) *Attorney, Agent, or Firm* — Patent Capital Group

(57) ABSTRACT

This disclosure describes techniques and methodologies of using passive continuous time (CT) delay line for high-speed CT analog-to-digital converter (ADC) applications. In a continuous-time residual producing stage common to these CT ADCs, a proper delay between the analog input and DAC output is crucial. Specifically, using an inductor-capacitor (LC) lattice based delay element to enable high-performance CT pipeline ADC and CT delta-sigma ($\Delta\Sigma$) ADC. The use of an LC lattice based delay element provides wide-band group delay for continuous-time signals with well-controlled impedance. This will be an essential circuit component to build a high-performance CT ADCs especially in architectures where the generation of a low-noise and low-distortion residual between the CT signal and its digitized version is needed. LC lattice based delay element enables noise-free, distortion-free wideband delay that is required for high speed continuous-time pipeline ADC and delta-sigma ADC.

22 Claims, 11 Drawing Sheets

(51) Int. Cl.
  *H03M 1/14* (2006.01)
  *H03M 1/06* (2006.01)
  *H03M 3/00* (2006.01)

(56) References Cited

U.S. PATENT DOCUMENTS

| | | | |
|---|---|---|---|
| 5,861,828 A | 1/1999 | Opris | |
| 6,064,507 A * | 5/2000 | Heflinger | H04B 10/69 250/214 A |
| 6,222,477 B1 | 4/2001 | Irie et al. | |
| 6,489,913 B1 | 12/2002 | Hanson et al. | |
| 6,809,672 B2 * | 10/2004 | Gupta | H03M 3/454 341/143 |
| 6,956,517 B1 * | 10/2005 | Baker | H03M 1/0626 341/118 |
| 7,280,064 B2 | 10/2007 | Lin | |
| 7,443,332 B2 | 10/2008 | Knudsen et al. | |
| 7,561,084 B1 * | 7/2009 | Wong | H03M 1/127 341/123 |
| 8,102,206 B2 | 1/2012 | Shibata | |
| 8,284,085 B2 | 10/2012 | Haroun et al. | |
| 8,570,200 B2 | 10/2013 | Ashburn et al. | |
| 8,896,475 B2 | 11/2014 | Shibata | |
| 2005/0057384 A1 * | 3/2005 | Chen et al. | 341/143 |
| 2007/0013571 A1 * | 1/2007 | Fujimoto | H03M 1/0836 341/155 |
| 2008/0238754 A1 | 10/2008 | Knudsen | |
| 2008/0272944 A1 * | 11/2008 | Zhou | H03M 3/352 341/143 |
| 2009/0055678 A1 * | 2/2009 | Kummaraguntla | G06F 1/04 713/600 |
| 2012/0086589 A1 | 4/2012 | Haroun et al. | |
| 2012/0086590 A1 * | 4/2012 | Satarzadeh | H03M 3/38 341/120 |
| 2012/0326906 A1 | 12/2012 | Haroun et al. | |
| 2013/0127646 A1 * | 5/2013 | Kumar | H03M 1/167 341/110 |
| 2013/0214946 A1 * | 8/2013 | Verbruggen | H03M 1/06 341/118 |
| 2014/0266821 A1 * | 9/2014 | Shibata | H03M 1/001 341/110 |
| 2015/0042501 A1 | 2/2015 | Shibata | |
| 2015/0109158 A1 * | 4/2015 | Dong | H03M 3/344 341/143 |

FOREIGN PATENT DOCUMENTS

| | | |
|---|---|---|
| WO | 2004/066494 | 8/2004 |
| WO | 2011/029103 | 3/2011 |

OTHER PUBLICATIONS

David Gubbins, Bumha Lee, Pavan Kumar Hanumolu, and Un-Ku Moon, "Continuous-Time Input Pipeline ADCs", *IEEE J. Solid State Circuits*, vol. 45, No. 8, Aug. 2010, pp. 1456-1468.

Ahmed Gharbiya, and David A. Johns, "A 12-bit 3.125 MHz Bandwidth 0-3 MASH Delta-Sigma Modulator", *IEEE J. Solid-State Circuits*, vol. 44, No. 7, Jul. 2009, pp. 2010-2018.

Partial European Search Report issued in EP Patent Application Serial No. 1516825.0 mailed Jul. 8, 2015, 8 pages.

Chinese Patent Application Serial No. 201410095239.1 filed Mar. 14, 2014.

European Patent Application Serial No. 14157548.0 filed Mar. 3, 2014.

European Search Report issued in EP Patent Application Serial No. 14157548.0 mailed Jul. 8, 2015, 7 pages.

Masoud Koochakzadeh et al., "Miniaturized Transmission Lines Based on Hybrid Lattice-Ladder Topology", IEEE Transactions on Microwave Theory and Techniques, vol. 58, No. 4, Apr. 2010, pp. 949-946, 8 pages.

W. Kester, "Oversannpling interpolating DACs", MT-017, tutorial documents, Analog Devices, Inc. available at http://www.analog.com/static/imported-files/tutorials/MT-017.pdf, 2009.

B.Y. Karmath et al., "Relationship between frequency response and setting time of operational amplifiers", IEEE Journal of Solid-State Circuits, vol. SC-9, No. 6, Dec. 1974.

David Gubbins, Bumha Lee, Pavan Kumar Hanumolu, and Un-Ku Moon, "A Continuous-Time Input Pipeline ADC", Custom Integrated Circuit Conference, Sep. 2008.

David Gubbins, Bumha Lee, Pavan Kumar Hanumolu, and Un-Ku Moon, "A Continuous-Time Input Pipeline ADC with inherent anti-alias filter", Custom Integrated Circuit Conference, Sep. 2009.

OA1 issued in Korean Patent Application Serial No. 10-2015-0026711 mailed Jan. 4, 2016.

English Summary of OA1 issued in Korean Patent Application Serial No. 10-2015-0026711 mailed Jan. 4, 2016, 6 pages.

Extended European Search Report issued in EP Patent Application Serial No. 1516825.0 mailed Feb. 3, 2016, 19 pages.

Kwang-Jin Koh et al., *A Millimeter-Wave* (40-45 GHz) *16-Element Phased-Array Transmitter in 0.18-μ Si Ge BiCMOS Technology*, IEEE Journal of Solid-State Circuits, vol. 44, No. 5, May 2009, 12 pages.

W.E. Thomson, *Delay Networks Having Maximally Flat Frequency Characteristics*, BNSDOCID: <XP55242803A, Paper No. 872, Radio Section, 621.392.5, (first received Mar. 14, 1949; revised Jul. 14, 1949), 4 pages.

* cited by examiner

STAGE X  STAGE X+1

STAGE X  STAGE X+1

STAGE X  STAGE X+1

STAGE X  STAGE X+1

STAGE X  STAGE X+1

STAGE X  STAGE X+1

STAGE X  STAGE X+1

STAGE X  STAGE X+1

KEY:

Kx1

Kx2

Kx3

Kx4

LC LATTICE DELAY LINE FOR HIGH-SPEED ADC APPLICATIONS

TECHNICAL FIELD OF THE DISCLOSURE

The present disclosure relates generally to analog-to-digital converters, and, more particularly, to delay lines used in high-speed analog-to-digital converters.

BACKGROUND

In many electronics applications, an analog input signal is converted to a digital output signal (e.g., for further digital signal processing). For instance, in precision measurement systems, electronics are provided with one or more sensors to make measurements, and these sensors may generate an analog signal. The analog signal would then be provided to an analog-to-digital converter (ADC) as input to generate a digital output signal for further processing. In another instance, an antenna generates an analog signal based on the electromagnetic waves carrying information/signals in the air. The analog signal generated by the antenna is then provided as input to an ADC to generate a digital output signal for further processing.

ADCs can be found in many places such as broadband communication systems, audio systems, receiver systems, etc. ADCs can translate analog electrical signals representing real-world phenomenon e.g., light, sound, temperature or pressure for data processing purposes. Designing an ADC is a non-trivial task because each application may have different needs in performance, power, cost and size. ADCs are used in a broad range of applications including Communications, Energy, Healthcare, Instrumentation and Measurement, Motor and Power Control, Industrial Automation and Aerospace/Defense. As the applications needing ADCs grow, the need for accurate and reliable conversion performance also grows.

OVERVIEW

This disclosure describes techniques and methodologies of using passive continuous time (CT) delay line for high-speed CT analog-to-digital converter (ADC) applications. In a continuous-time residual producing stage common to these CT ADCs, a proper delay between the analog input and DAC output is crucial. Specifically, using an inductor-capacitor (LC) lattice based delay element to enable high-performance CT pipeline ADC and CT delta-sigma ($\Delta\Sigma$) ADC. The use of an LC lattice based delay element provides wide-band group delay for continuous-time signals with well-controlled impedance. This will be an essential circuit component to build a high-performance CT ADCs especially in architectures where the generation of a low-noise and low-distortion residual between the CT signal and its digitized version is needed. LC lattice based delay element enables noise-free, distortion-free wideband delay that is required for high speed continuous-time pipeline ADC and delta-sigma ADC.

DESCRIPTION OF EXAMPLE EMBODIMENTS OF THE DISCLOSURE

Figure 1:
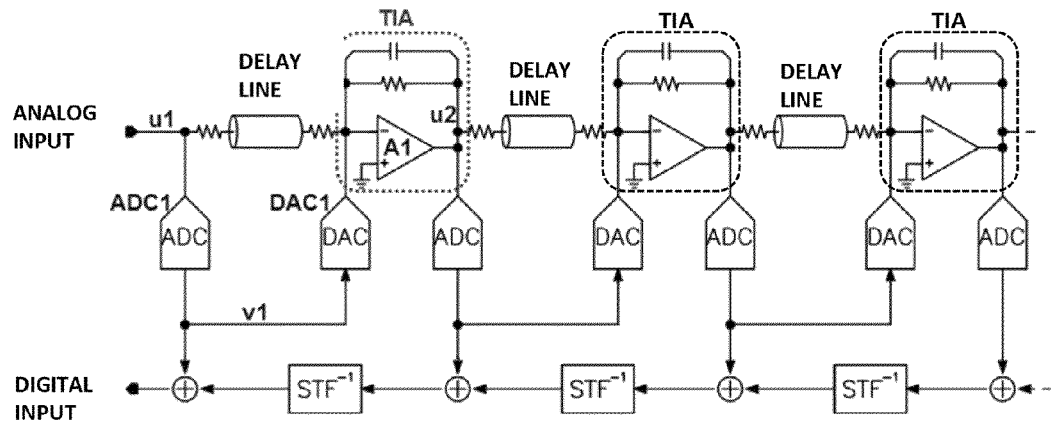
FIG. 1 is a simplified schematic diagram illustrating a system architecture of a continuous time pipeline analog-to-digital converter comprising a plurality of delay lines, according to some embodiments of the disclosure.

Analog to digital converters (ADCs) are devices that converts a continuous physical quantity to a digital number that represents the quantity's amplitude. The conversion involve quantization of the analog input signal, so it would introduce a small amount of error. Typically the quantization occurs through periodic sampling of the analog input signal. The result is a sequence of digital values (i.e., a digital signal) that has converted a continuous-time and continuous-amplitude analog input signal to a discrete-time and discrete-amplitude digital signal.

An ADC is usually defined by the following application requirements: its bandwidth (the range of frequencies of analog signals it can properly convert to a digital signal), its resolution (the number of discrete levels the maximum analog signal can be divided into and represented in the digital signal), and its signal to noise ratio (how accurately the ADC can measure signal relative to the noise the ADC introduces). Analog-to-digital converters (ADCs) have many different designs, which can be chosen based on the application requirements.

Many modern ADC designs, such as pipeline ADCs and multi-stage noise shaping ADCs, comprises a plurality of stages for digitizing the signal and errors of the system in order to meet design requirements related to bandwidth, resolution, and the signal to noise ratios. One or more of these stages typically uses the original analog input signal as a reference signal to produce a residual signal (i.e., an error between a filtered version or a reconstructed version of the analog input signal) in order to reduce the amount of noise introduced by the ADC and/or to increase the resolution of the output. The process for producing the residual usually requires the original analog input signal to match the phase of the filtered version of the original analog input signal, but the filtering of the original analog input signal introduces a delay. Thus, a delay line is typically provided to delay the original analog input signal to match the phase of the filtered version in order to produce a desired residual signal. The present disclosure describes an improved delay line used in providing a delayed analog input signal, e.g., for producing the residual signal (other applications are also envisioned), using continuous-time (CT) circuitry Example Application: Continuous Time Pipeline Analog-to-Digital Converters One example circuit using delay lines to delay an analog input signal is a pipeline analog-to-digital converter (ADC). Traditionally, a pipeline ADC provide delay lines using switched-capacitor circuits. Switch-capacitor circuits provide a sample-and-hold-type of delay line for delaying the analog input signal in a residual producing stage of an ADC. In the present disclosure, the pipeline ADC having one or more delay lines do not use switched-capacitor circuits to provide the delay lines. Rather, continuous-time CT circuitry is used. The result is a (total) continuous-time (CT) pipeline analog-to-digital converter (ADC), which utilizes (all) CT circuitry to realize a pipeline ADC.

FIG. 1 is a simplified schematic diagram illustrating a system architecture of a continuous-time (CT) pipeline ADC comprising a plurality of delay lines, according to some embodiments of the disclosure. In particular, FIG. 1 illustrates the first three stages of a CT pipeline ADC. The analog input signal u1 gets digitized by a fast/coarse ADC (shown as ADC1, could be realized using a flash ADC), and the digital output of the fast/coarse ADC v1 is used to drive a current digital-to-analog converter (DAC) (shown as DAC1). The input voltage signal u1 is also converted into a signal current with some delay through the resistor and the delay line component. The difference between the delayed signal current and the current-mode DAC output current is amplified by the transimpedance amplifier (shown as "TIA") which includes of an amplifier A1 and a shunt-shunt feedback network. The output of the amplifier, u2, becomes the analog input voltage signal into the second stage and so on. At the bottom of FIG. 1, the reconstruction of digital signal is illustrated. The digital outputs of each stage are generated by the ADCs and they are added together backwards with filtering response 1/STF (STF: the signal transfer function of each individual CT pipeline stage). The schematic circuit diagram in FIG. 1 is drawn single-ended but practical implementations are usually differential.

One reason for replacing switched-capacitor circuits in a discrete time (DT) delay line (used in traditional pipeline ADCs) with CT circuitry to provide a CT delay line is power consumption. The CT pipeline ADC having CT delay lines would generally have several times lower power consumption than the traditional pipeline ADCs while providing the same performance. For DT delay lines, the amplifier output current for charging the capacitors in switch-capacitor circuits is rather high in the beginning when the capacitors are charging, while the amplifier output current for the CT circuitry is generally constant and several times smaller than the maximum amplifier output current for switch-capacitor circuits (while keeping performance as a constant between the two). As a result, the power amplifiers in the pipeline ADC having DT delay lines need to be more power hungry (thus, consuming more power) than the power amplifier in the pipeline ADC having CT delay lines (while maintaining the same signal-to-noise ratio performance).

Importance of a Robust Delay Line

Delay lines, such as delay lines shown in FIG. 1, play a crucial role in a CT pipeline ADC. When implemented with real circuitry, the ADC module and the DAC module in FIG. 1 will exhibit some inherent delay. In a typical integrated circuit (IC) implementation, the ADC and DAC will be clocked by a clock signal CK. This CK determines the sampling rate of the overall CT pipeline ADC. The delay through the ADC and the DAC could be around or equivalent 1 to 2 (in most cases 1.5) CK periods. The delay would normally depend on the circuitry and application. If not compensated accordingly in the analog signal path through the resistor (between the input and the DAC output), there will be a phase difference between the analog input signal current and the current-mode DAC output current. This phase difference will cause a larger residue current signal that needs to be processed by the amplifier and the following CT pipeline stages. As a result, the amplifier needs to consume more power to deliver larger currents at certain distortion performance, and the inter-stage gain between pipeline stages needs to be reduced as well. The smaller inter-stage gain will reduce the thermal power efficiency of the pipeline ADC front-end and raise both power and complexity for a given resolution performance. This degradation will become worse as the input signal frequency increases.

Figure 2:
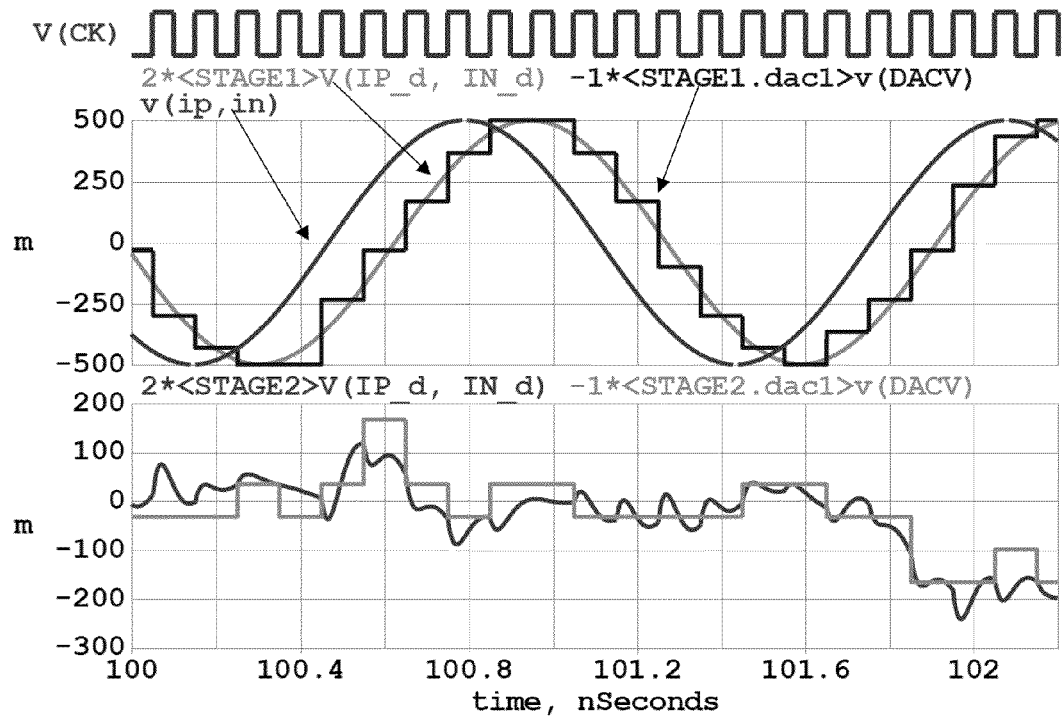
FIG. 2 is a plot of exemplary waveforms inside a continuous time pipeline analog-to-digital converter such as the one shown in FIG. 1.

FIG. 2 is a plot of exemplary waveforms inside a continuous time (CT) pipeline analog-to-digital converter (ADC) such as the one shown in FIG. 1. In particular, FIG. 2 illustrates some typical simulated CT pipeline ADC waveforms. CK in the top subplot is the clock signal waveform. In the middle subplot, V(ip,in) is the analog input signal voltage. The delayed analog input voltage signal (labeled as 2*<STAGE1>V(IP_d,IN_d)) and the DAC output voltage (labeled as −1*<STAGE1.dac1>v(DACV), and referred herein generally as the filtered version of the analog input signal or a reconstructed version of the analog input signal) are plotted in FIG. 2, respectively.

The delayed analog signal and the DAC output signal (the filtered analog input signal) have been scaled to voltage signals from their corresponding current signals in order to better illustrate the importance of the delay. In the simulation, the ADC exhibits 1 clock cycle delay while the DAC exhibits an equivalent of 0.5 clock cycle delay. So it can be observed that the DAC output waveform is delayed by approximately 1.5 clock cycles with respect to the original analog input signal v(ip, in). With proper delay through the delay line, the delayed analog signal aligns to the DAC output signal and the residue signal can thus be minimized.

At the bottom subplot of FIG. 2, the delayed analog input signal (labeled as 2*<STAGE2>V(IP_d,IN_d), which is also the output of the first stage, having a continuous and smooth appearance) and the DAC output signal (labeled as −1*<STAGE1.dac1>v(DACV), having a staircase appearance) of the second pipeline stage are plotted. With a proper delay line for aligning the delayed analog input signal with the filtered analog input signal, these two signals are aligned and the DAC output signal tracks the analog input signal as expected.

Example Application: A Residual Producing Stage or Circuit

Figure 3:
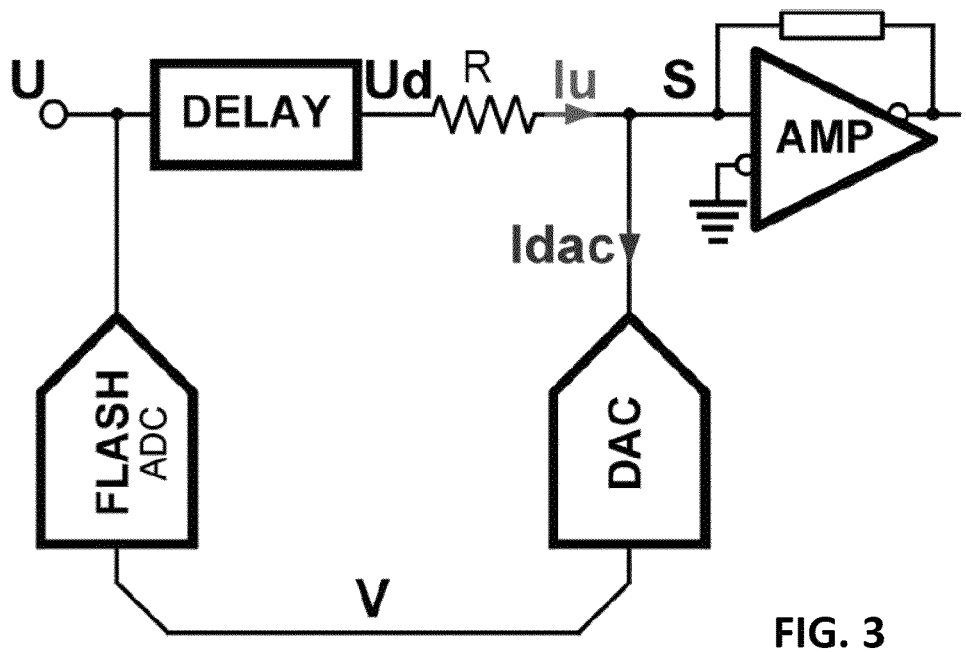
FIG. 3 is a simplified schematic diagram illustrating a residual producing stage or circuit, according to some embodiments of the disclosure.

FIG. 3 is a simplified schematic diagram illustrating a residual producing stage or circuit, according to some embodiments of the disclosure. In particular, FIG. 3 illustrates one exemplary idea of using a delay line in a residual producing circuit. The residual circuit conceptualizes a part of a DAC configured to produce a residual signal. FLASH is a flash ADC which digitizes the analog input signal U and outputs a digital code V. The DAC produces an analog current ($I_{dac}$) according to the digital signal V (i.e., a filtered version of analog input signal U). The delay line, DELAY, delays the analog input signal U and produces a delayed version $U_d$. Then the delayed analog signal $U_d$ is converted into a current $I_u$. The current residual $I_{res}=I_u-I_{dac}$ is generated at the summation node S. This residual is proportional to the quantization error produced during the quantization process inside FLASH. The summation node S in FIG. 3 is the virtual ground generated by the amplifier AMP with a shunt-shunt negative feedback network. The time delay through the DELAY element (e.g., a CT delay line of the present disclosure) should match the delay through the FLASH and DAC circuit blocks, which may be equivalent to 1.5 times of the system clock period ($T_{CK}$).

Figure 4:
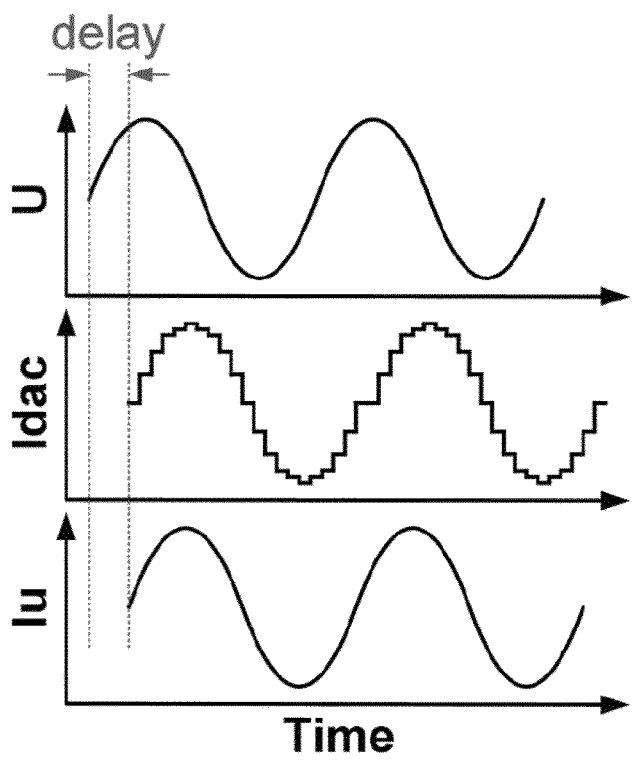
FIG. 4 is a plot of exemplary waveforms of signals associated with the residual producing stage, according to some embodiments of the disclosure.

FIG. 4 is a plot of exemplary waveforms of signals associated with the residual producing stage, according to some embodiments of the disclosure. In particular, FIG. 4 illustrates the possible signal waveforms for the exemplary circuit blocks shown in FIG. 3. Without the DELAY block adding the necessary delay, the phase difference between the analog input signal U and the DAC output $I_{dac}$ will remain uncompensated and increase the residual.

Understanding the Improved, Continuous-Time Delay Line

Figure 5:
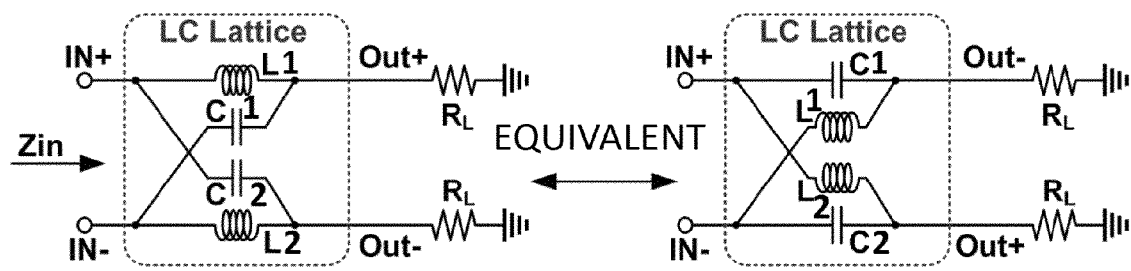
FIG. 5 shows two simplified schematic diagrams illustrating a resonant lattice circuit, according to some embodiments of the disclosure.

FIG. 5 shows two simplified schematic diagrams illustrating a resonant (LC) lattice circuit/structure, according to some embodiments of the disclosure. In particular, FIG. 5 illustrates a schematic of an LC lattice structure/circuit for providing a delay element as a part of a CT delay line, e.g., in a residual producing circuit as seen in FIG. 4, or in a CT pipeline ADC as seen in FIG. 1 (note these example applications are meant to be illustrative and non-limiting).

The LC lattice structure for generating a delayed differential analog input signal pair (OUT+ and OUT−) comprises of two inductive components L1 and L2 (two inductors) and two capacitive components C1 and C2 (two capacitors), wherein either (1) the two inductive components are cross coupled or (2) the two capacitive components are cross coupled. IN+ and IN− stand for the analog input ports for receiving a differential analog input pair while OUT+ and OUT− stand for the output ports for outputting the delayed differential analog input pair. $R_L$ is the load resistance. The input signal goes through the inductors at low frequencies and through the capacitors at high frequencies. Thus a phase shift of 180 degrees happens from low to high frequencies and this yields a stable group delay across broad frequencies.

The differential signal transfer function, from the input to the output, can be written as:

$$\frac{V_{out\_diff}}{V_{in\_diff}} = \frac{1-s^2LC}{1+\frac{sL}{R_l}+s^2LC}$$

The line impedance of the lattice delay line, $Z_{DL}$, can be defined as:

$$Z_{DL}=\sqrt{L/C}$$

And the line resonant frequency, $f_0$, as:

$$f_0 = \frac{1}{2\pi\sqrt{LC}}$$

The signal transfer function equals to 1 at DC and −1 at high frequencies, which confirms the 180-degree phase shift and the associated group delay. At the resonant frequency $f_0$, the signal transfer function becomes:

$$\frac{V_{out\_diff}}{V_{in\_diff}} = \frac{2jR_L}{Z_{DL}}$$

There is a 90 degrees phase shift at $f_0$ and the magnitude response depends on the ratio between $Z_{DL}$ and $R_L$. If $Z_{DL}$ is made to be 2 $R_L$, it can be shown that the magnitude of the signal transfer function is always equal to unity at any frequency. The differential input impedance, $Z_{in\_diff}$, looking into the delay line input ports, IN+ and IN−, can be written as:

$$Z_{in\_diff} = \frac{1+\frac{sL}{R_L}+s^2LC}{1+4sCR_L+s^2LC}2R_L$$

Again, at $f_0$, the differential input impedance is equal to $Z_{DL}^2/(4R_L)$. And if $Z_{DL}$ is made equal to 2RL, then the differential input impedance looking into the LC lattice structure would always be equal to $2R_L$ at any frequency. In other words, the LC lattice structure in this case is transparent from the input to the load.

As a delay element or delay line, e.g., in the residual producing circuit as shown in FIG. 3, it is desirable to make $Z_{DL}$ equal $2R_L$. This yields constant differential input impedance into the lattice delay line which would simplify power matching and make the LC lattice easier to drive. It also yields a unity-magnitude transfer function which makes it possible for the circuit shown in FIG. 3 to produce a fine residual between the analog input signal and its digitized version across a wide range of frequencies.

In actual circuit implementations, the $Z_{DV}$ can be adjusted through changing the capacitor C. This can be achieved by either using analog varactor and adjust its tuning voltage or using digitally controlled capacitor banks/arrays.

Cascading LC Lattice Structures in a Delay Line

Figure 6:
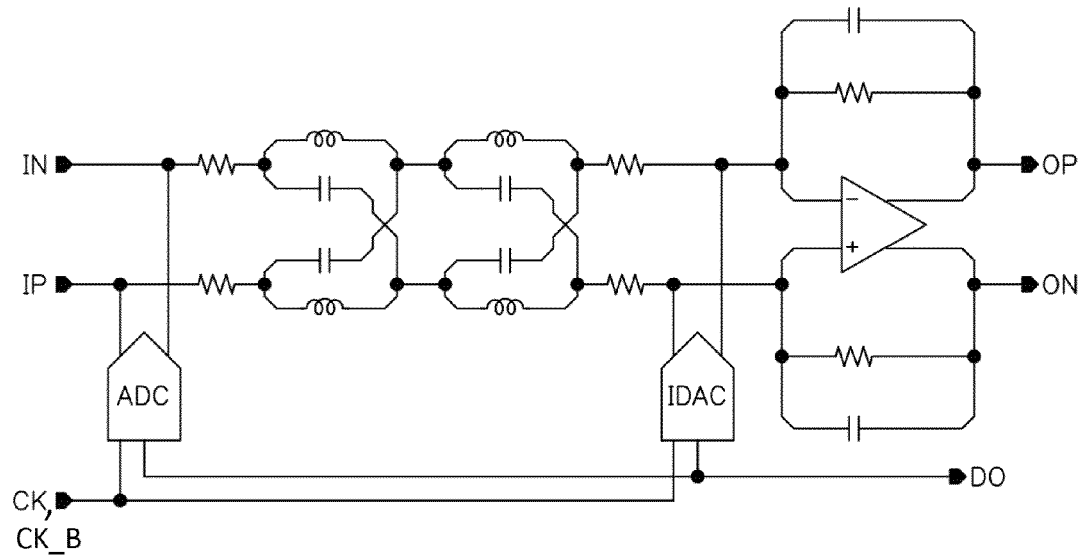
FIG. 6 shows a residual producing stage having cascaded resonant lattice circuits, according to some embodiments of the disclosure.

FIG. 6 shows a residual producing stage having cascaded resonant (LC) lattice circuits, according to some embodiments of the disclosure. In particular, FIG. 6 illustrates a single continuous time (CT) pipeline ADC stage with multiple LC lattice delay modules/structures in greater detail. Here a differential circuit topology is shown. IN, IP are input ports and OP and ON are output ports. Two cascaded stages of LC lattice delay modules are used, as an example, to achieve sufficient wideband delay. "ADC" in the FIGURE is the faster ADC that digitizes the analog input signal directly and "IDAC" is the current DAC that feeds back digitized currents to the summation nodes of the amplifier. Both ADC and IDAC are clocked by a clock signal, e.g., differential clock signals CK and CK_B. DO is the digital output generated by this CT pipeline stage.

The number of lattice delay stages/structures is not limited to two as shown in FIG. 6. It can be a single stage if the required delay is small or more than two stages if the required delay is large. When multiple LC lattice stages are used, their resonant frequencies ($1/\sqrt{LC}$) do not necessarily have to be the same. The group delay achieved by a LC lattice is peaked at its resonant frequency. Thus the resonant frequencies of different LC lattice stages/structures can be placed at adjacent frequencies in order to achieve a wider band group delay.

Figure 7A:
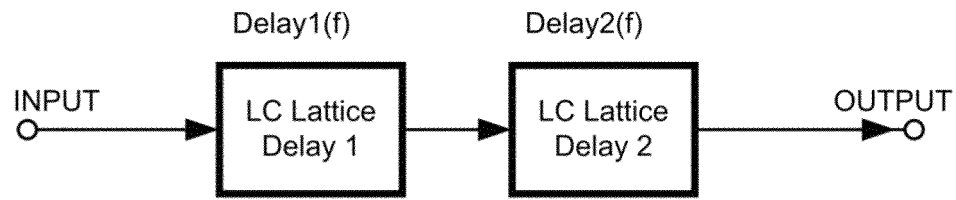
FIG. 7A shows a simplified schematic diagram of cascaded resonant lattice circuits; according to some embodiments of the disclosure.

FIG. 7A shows a simplified schematic diagram of cascaded resonant lattice circuits; according to some embodiments of the disclosure. The schematic diagram shows an example where a delay line comprises two LC lattice structures (LC Lattice Delay 1 and LC Lattice Delay 2) cascaded in multiple stages where each stage has a different resonant frequency to provide a wide-band delay over frequency.

Figure 7B:
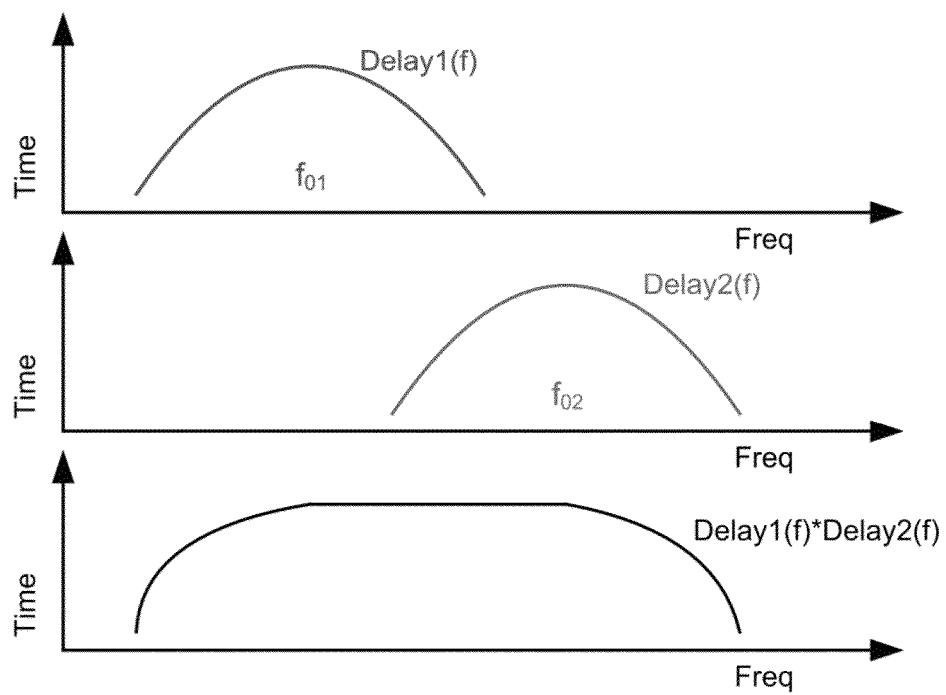
FIG. 7B shows the effect of the delay over frequency provided by the cascaded resonant lattice circuits, according to some embodiments of the disclosure.

FIG. 7B shows the effect of the delay over frequency provided by the cascaded resonant lattice circuits, according to some embodiments of the disclosure. One LC lattice structure would exhibit a delay peaked at its resonant frequency ($f_{o1}$ as seen for Delay1(f) for LC lattice delay 1 and $f_{o2}$ as seen for Delay2(f) for LC lattice delay 2), similar to the impedance of a tuned LC tank. Therefore, by cascading two LC delay stages with different resonant frequencies, one can produce a broad delay over wider frequency range (Delay1(f)*Delay2(f)), which is useful for high-speed ADCs with a large bandwidth requirement. This type of cascading is not limited to two stages and can be applied to generally many stages (3, 4, 5, 6 and so on). Each LC lattice structure in a delay line having cascaded LC lattice structures will comprise of 2 inductors for differential signaling. For two cascaded LC lattice structures, 4 inductors or inductive components are used.

Example: Determining Values for L and C

Figure 8:
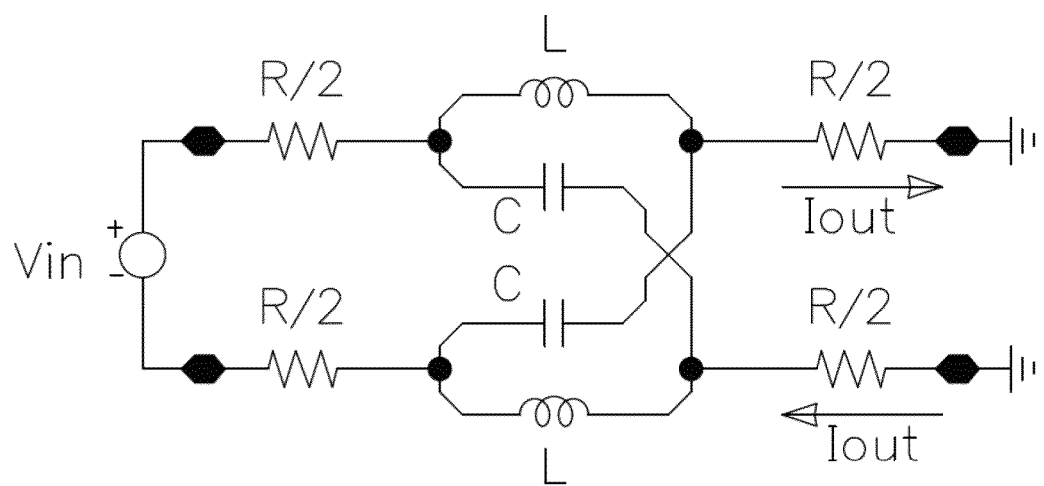
FIG. 8 shows a resonant lattice circuit/structure, according to some embodiments of the disclosure.

FIG. 8 shows an exemplary resonant (LC) lattice circuit/structure, according to some embodiments of the disclosure. The LC lattice structure has two inductive components and two capacitive components, wherein either (1) the two inductive components are cross coupled or (2) the two capacitive components are cross coupled. In this example, for illustration, the capacitive components are cross coupled. Applying the concept of LC lattice structures to provide a delay line in an ADC is not trivial. The following outlines the equations which may be used to determine the inductance values L and capacitance values C for the inductive components and capacitive components respectively to provide a particular delay to match a delayed differential analog input pair with a filtered version of the differential analog input pair.

The voltage to current transfer function G(s) of this LC lattice structure shown in FIG. 8 can be represented as:

$$G(s) = \frac{i_{out}}{v_{in}} = \frac{(1-\sqrt{LC}s)(1+\sqrt{LC}s)}{\left(1+\frac{L}{R}s\right)\left(\frac{1}{R}+Cs\right)}$$

The above can be simplified to:

$$G(s) = \frac{1-\frac{s}{\omega_0}}{1+\frac{s}{\omega_0}} \times \frac{1}{2R}$$

where $$Z_o = \sqrt{\frac{L}{C}}, \omega_0 = \frac{1}{\sqrt{LC}}, R = Z_o$$

The amplitude, phase, and delay of G(s) are as follows:

Amplitude $|G(s)| = \frac{1}{2R}$ which is constant over frequency

Phase: $\angle G(s) = -2\tan^{-1}\frac{\omega}{\omega_0}$

Delay: $-\frac{d\angle G(s)}{d\omega} = \frac{2\omega_0}{\omega^2+\omega_0^2}$

Design parameters for the continuous time delay line having one or more (cascaded) LC lattice structures comprises the characteristic impedance $Z_0$, the number of cascaded lattice stages N in the delay line (N=1 if only one lattice structure is used, N=2 if two lattice structures are cascaded one after another, and so on), and the clock frequency of the ADC $f_{ck}$ (i.e., corresponding to the delay needed to match the phase of the delayed signal and the filtered signal processed by the DAC and ADC seen in FIG. 3). If the delay is matched to 1.5× the clock period of the ADC ($T_{ck}$):

$$L = \frac{3Z_o}{4Nf_{CK}} \text{ and } C = \frac{3}{4NZ_of_{CK}}$$

Hardware Design: Reducing Coupling Between Delay Lines

The inductors in the LC lattice delay line for CT pipeline ADC can be realized as either single-ended planar inductors or differential planar inductors with tight coupling. The planar layout, which means a rounding wire structure on the wiring of the integrated circuits, is generally needed to realize a required inductance value needed for these applications. Differential inductors offer larger low-frequency inductance due to mutual coupling and higher high-frequency quality factor. However, differential planar inductors are more sensitive to common-mode interference magnetic field as it converts a common magnetic field into differential currents.

Figure 9A:
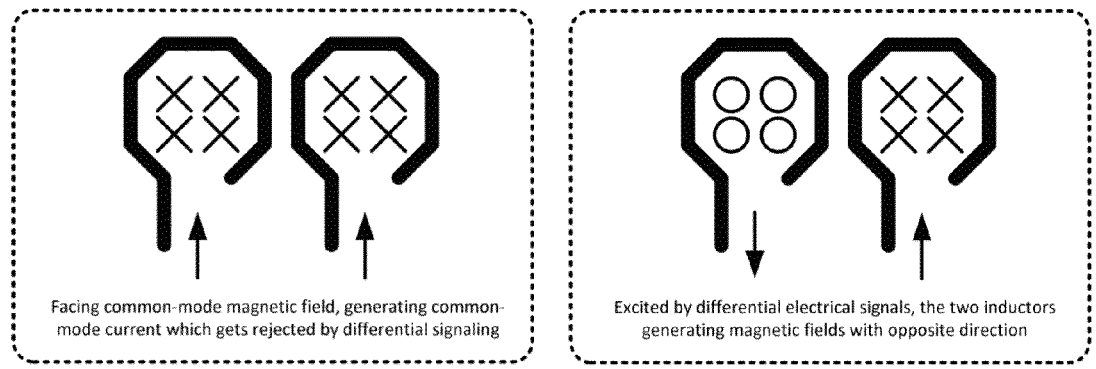
FIG. 9A shows schematic diagrams illustrating directionality of magnetic flux patterns, according to some embodiments of the disclosure.

FIG. 9A shows schematic diagrams illustrating directionality of magnetic flux patterns, according to some embodiments of the disclosure. On the left shows two single-ended planar inductors generating same-direction electrical current signals, when affected by a common-mode magnetic field, the currents induced by the common-mode magnetic field would be rejected by differential signaling. On the right shows two single-ended planar inductors excited by differential electrical signals, the generated magnetic fields are in opposite directions.

In comparison, a pair of single-ended inductors that generate magnetic fields with opposite flux directions are less sensitive to common-mode field interference. The same single-ended pair inductors also generate less net magnetic field on the environment when excited by differential signals. This is due to the cancellation of the generated fields with opposite flux directions. In the first order, the common magnetic field will be converted into a pair of common mode currents which are rejected by the differential signaling.

A CT pipeline ADC, or any multi-stage ADC, would typically have a plurality of ADC stages. If a delay line in used in one or more of these ADC stages, the whole ADC can potentially have many delay lines where each delay line includes one or more (cascaded) LC lattice structures implemented as planar inductors in the integrated circuit design. The magnetic coupling between these planar inductors of these delay lines could cause signal to leak from one delay line to another, therefore degrade system performance. As a result, optimize the planar inductor placement to minimize overall magnetic coupling is crucial for high performance CT pipeline ADC (or any (multi-stage) circuit employing the LC lattice structures as delay lines).

Figure 9B:
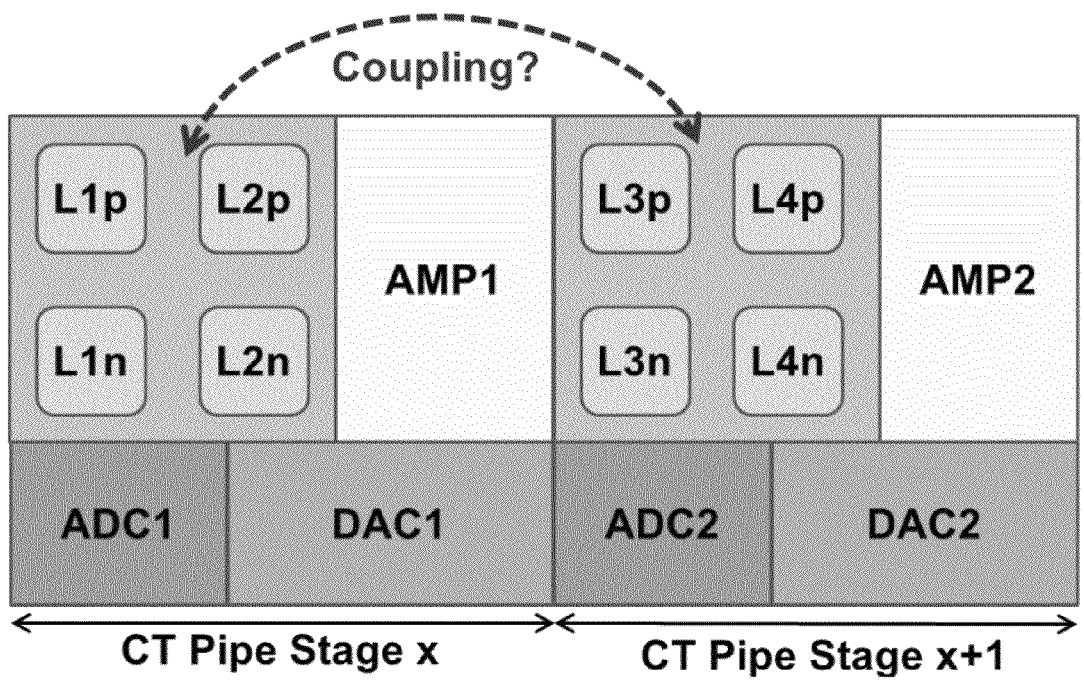
FIG. 9B shows a top view of a continuous time pipeline analog-to-digital converter layout in an integrated circuit, according to some embodiments of the disclosure.

FIG. 9B shows a top view of a continuous time pipeline analog-to-digital converter layout in an integrated circuit, according to some embodiments of the disclosure. In particular, FIG. 9B illustrates an example of a CT pipeline ADC layout having at least two pipeline stages (showing only two stages, CT Pipe Stage x and CT Pipe Stage x+1 for simplicity). Each pipeline stage includes two cascaded differential LC lattice structures. Each LC lattice structures includes two single-ended planar inductors (thus each pipeline stage in this example has four single-ended planar inductors). For example, inductors L1$p$ and L1$n$ belong to the first LC lattice delay structure, L2$p$, L2$n$ belong to the second LC lattice delay structure and so on. In other words, the first CT delay line of CT Pipe Stage x comprises two cascaded lattice structures having two inductive components L1$p$, L1$n$ in a first lattice structure, and two inductive components L2$p$, and L2$n$ in a second lattice structure. The second CT delay line of CT Pipe Stage x+1 comprises two cascaded lattice structures having two inductive components L3$p$, L3$n$ in a first lattice structure, and two inductive components L4$p$, and L4$n$ in a second lattice structure.

It can be seen that L1$p$, L1$n$, L2$p$, and L2$n$, are spatially arranged as four planar inductors according to the following grid pattern (similar grid also applies to L3$p$, L3$n$, L4$p$, and L4$n$):

| L1$p$ | L2$p$ |
|-------|-------|
| L1$n$ | L2$n$ | where L1$p$ and L2$p$ are connected in series, L1$n$ and L2$n$ are connected in series, L3$p$ and L4$p$ are connected in series, L3$n$ and L4$n$ are connected in series. The two of the CT delay lines each have a differential input port IN+, IN− and a differential output port OUT+, OUT−, IN+ is connected to one terminal of L1$p$; OUT+ is connected to one terminal of L2$p$; IN− is connected to one terminal of L1$n$; and OUT− is connected to one terminal of L2$n$.

The first pipeline stage CT Pipe Stage x also includes ADC1, DAC1, and AMP1. The second pipeline stage CT Pipe Stage x+1 also includes ADC2, DAC2, and AMP2. While this example shows potential coupling between delay lines in two pipeline stages of a CT pipeline ADC, the coupling exists also in other ADCs or circuits where multiple delay lines having the LC lattice structures are used.

The magnetic coupling between L1$p$, L1$n$, L2$p$, L2$n$ and L3$p$, L3$n$, L4$p$, L4$n$ should be minimized. It should be noted that coupling inside a single CT pipe stage usually causes some linear effect on the LC lattice response and as a result it is not a significant source of non-linear errors. One design freedom on these planar inductors is their magnetic flux directions induced by the current flows through the inductors for a differential signal applied to the LC lattice structure. In general, a planar inductor can have its magnetic flux pointing up or pointing down. Pointing up means the flux goes from the substrate up towards the surface of the silicon chip, and is labeled as 0. Pointing down means the flux goes from the surface of the chip towards the substrate, and is labeled as X.

To reduce the magnetic coupling between the inductive components of two delay lines in adjacent stages, a special magnetic flux pattern is implemented in the design of these planar inductors. Specifically, a magnetic flux pattern of the inductive components of the plurality of CT delay lines has a checkered pattern, when a differential alternating current (AC) signal is applied an input of each CT delay line, to reduce coupling between the inductive components in between the plurality of CT delay lines, said checkered pattern alternating a particular flux directionality of adjacent inductive components between (1) X=an inductive component having flux going from the substrate up towards the surface of the integrated circuit chip and (2) O=an inductive component having flux going from the surface of the integrated circuit chip towards the substrate of the integrated circuit chip. The checkered pattern refers to the X O arrangement in the magnetic flux pattern, where X and O alternates for inductors within a particular stage (i.e., delay line) and for inductors in an adjacent stage (i.e., an adjacent delay line).

Figure 10:
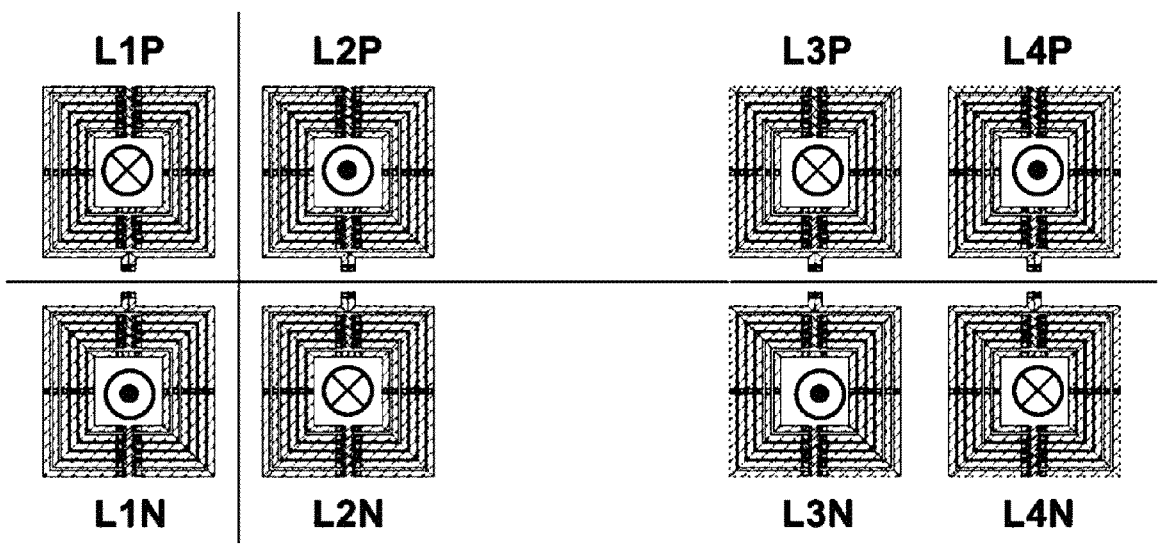
FIG. 10 shows a top-view of 8 planar inductors of in 2 continuous pipeline analog-to-digital converter stages illustrating a magnetic flux pattern, according to some embodiments of the disclosure.

FIG. 10 shows a top-view of 8 planar inductors of in 2 continuous pipeline analog-to-digital converter stages illustrating a magnetic flux pattern, according to some embodiments of the disclosure. This example illustrates one preferred magnetic flux pattern for reducing the coupling between delay lines. Specifically, FIG. 9B illustrates one of the possible placement where L1P, L1N, L2P, L2N are placed as "X, O, O, X". L3P to L4N are placed similarly. The pattern is referred to as a checked pattern because the directionality of the planar inductors alternates between X and O.

The direction of the current caused by a differential signal is a positive current flow from IN+ to OUT+ for the upper inductor and OUT− to IN− for the lower inductor in FIG. 3, or inverse direction for both inductors. On the other hand, a common-mode signal applied to the LC lattice structure causes the positive current flow from IN+ to OUT+ for the upper inductor and IN− to OUT− for the lower inductor. Therefore the magnetic flux caused by the common-mode signal will be different from the flux caused by the differential signal.

Through some investigations and simulations, it can be shown that (e.g., for a CT pipeline ADC that contains two cascaded LC lattice structures in each pipeline stage), the optimum planar inductor placement for minimizing magnetic coupling is XOOX pattern shown in FIG. 9B if 4 inductors are in each delay line. It should also be noted that XOOX pattern is equivalent to OXXO pattern due to the differential circuit nature.

Figure 11A:
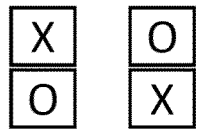
FIG. 11A-B show possible magnetic flux patterns for 4 planar inductors in delay lines of adjacent stages in an analog-to-digital converter, according to some embodiments of the disclosure.
Figure 11B:
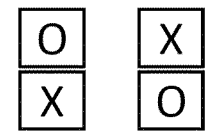

FIG. 11A-B shows possible magnetic flux patterns for 4 planar inductors in delay lines of adjacent stages in an analog-to-digital converter, according to some embodiments of the disclosure. In this example, two delay lines are present in two adjacent stages (one delay line in stage x and one delay line in stage x+1), each stage having 2 inductors (one LC lattice structure). The checkered pattern is provided to reduce the coupling between the 2 inductors in the stage x and the 2 inductors in stage x+1. The pattern shown in FIG. 11A is equivalent to the pattern shown in FIG. 11B.

Figure 12A:
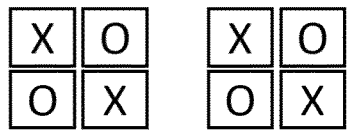
FIG. 12A-B show possible magnetic flux patterns for 8 planar inductors in delay lines of adjacent stages in an analog-to-digital converter, according to some embodiments of the disclosure.
Figure 12B:
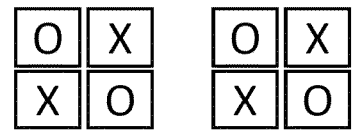

FIG. 12A-B shows possible magnetic flux patterns for 8 planar inductors in delay lines of adjacent stages in an analog-to-digital converter, according to some embodiments of the disclosure. In this example, two delay lines are present in two adjacent stages (one delay line in stage x and one delay line in stage x+1), each stage having 4 inductors (2 cascaded LC lattice structures). The checkered pattern is provided to reduce the coupling between the 4 inductors in the stage x and the 4 inductors in stage x+1. The pattern shown in FIG. 12A is equivalent to the pattern shown in FIG. 12B.

Figure 13A:
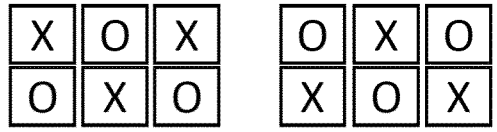
FIG. 13A-B show possible magnetic flux patterns for 12 planar inductors in delay lines of adjacent stages in an analog-to-digital converter, according to some embodiments of the disclosure.
Figure 13B:
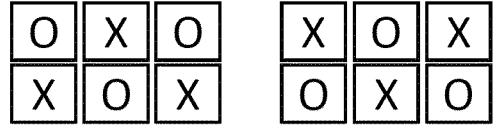

FIG. 13A-B shows possible magnetic flux patterns for 12 planar inductors in delay lines of adjacent stages in an analog-to-digital converter, according to some embodiments of the disclosure. In this example, two delay lines are present in two adjacent stages (one delay line in stage x and one delay line in stage x+1), each stage having 6 inductors (3 cascaded LC lattice structures). The checkered pattern is provided to reduce the coupling between the 6 inductors in the stage x and the 6 inductors in stage x+1. The pattern shown in FIG. 13A is equivalent to the pattern shown in FIG. 13B.

Figure 14A:
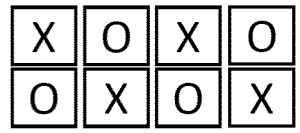
FIG. 14A-B show possible magnetic flux patterns for 16 planar inductors in delay lines of adjacent stages in an analog-to-digital converter, according to some embodiments of the disclosure.
Figure 14B:
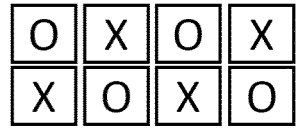

FIG. 14A-B shows possible magnetic flux patterns for 16 planar inductors in delay lines of adjacent stages in an analog-to-digital converter, according to some embodiments of the disclosure. In this example, two delay lines are present in two adjacent stages (one delay line in stage x and one delay line in stage x+1), each stage having 8 inductors (4 cascaded LC lattice structures). The checkered pattern is provided to reduce the coupling between the 8 inductors in the stage x and the 8 inductors in stage x+1. The pattern shown in FIG. 14A is equivalent to the pattern shown in FIG. 14B.

Figure 15:
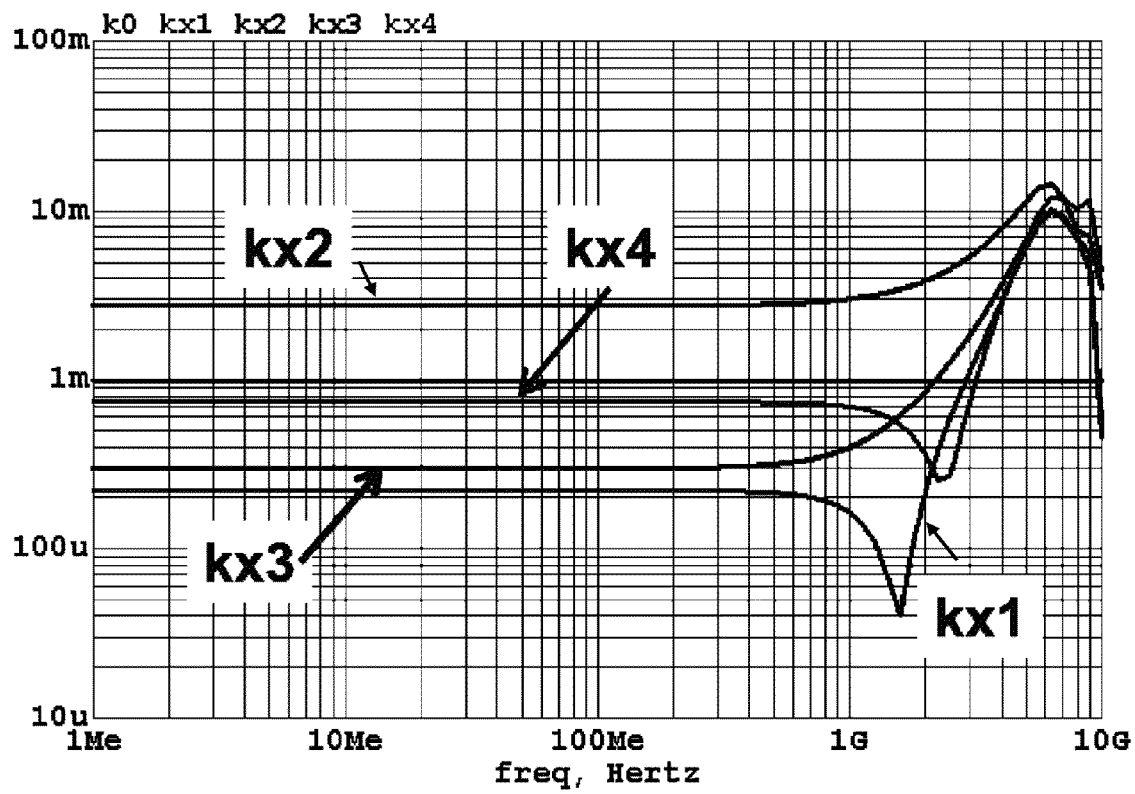
FIG. 15 shows a plot of simulated magnetic coupling factor between adjacent stages in an analog-to-digital converter for planar inductors having 4 different magnetic flux patterns, according to some embodiments of the disclosure.
Figure 15:
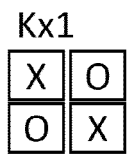
Figure 15:
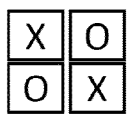
Figure 15:
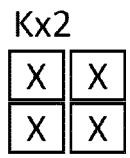
Figure 15:
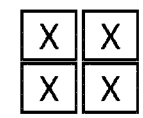
Figure 15:
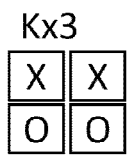
Figure 15:
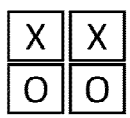
Figure 15:
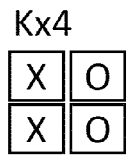
Figure 15:
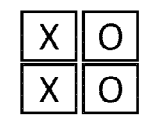

FIG. 15 shows a plot of simulated magnetic coupling factor between adjacent stages in an analog-to-digital converter for planar inductors having 4 different magnetic flux patterns Kx1 (XOOX), Kx2 (XXXX), Kx3 (XXOO), and Kx4 (XOXO), according to some embodiments of the disclosure. In particular, FIG. 15 shows simulated magnetic coupling factors between two adjacent CT pipeline stages with different inductor placement patterns. Each CT pipeline ADC stage contains two cascaded LC lattice structures. The XOOX pattern (Kx1) gives the lowest coupling up to 2 GHz.

Figure 16:
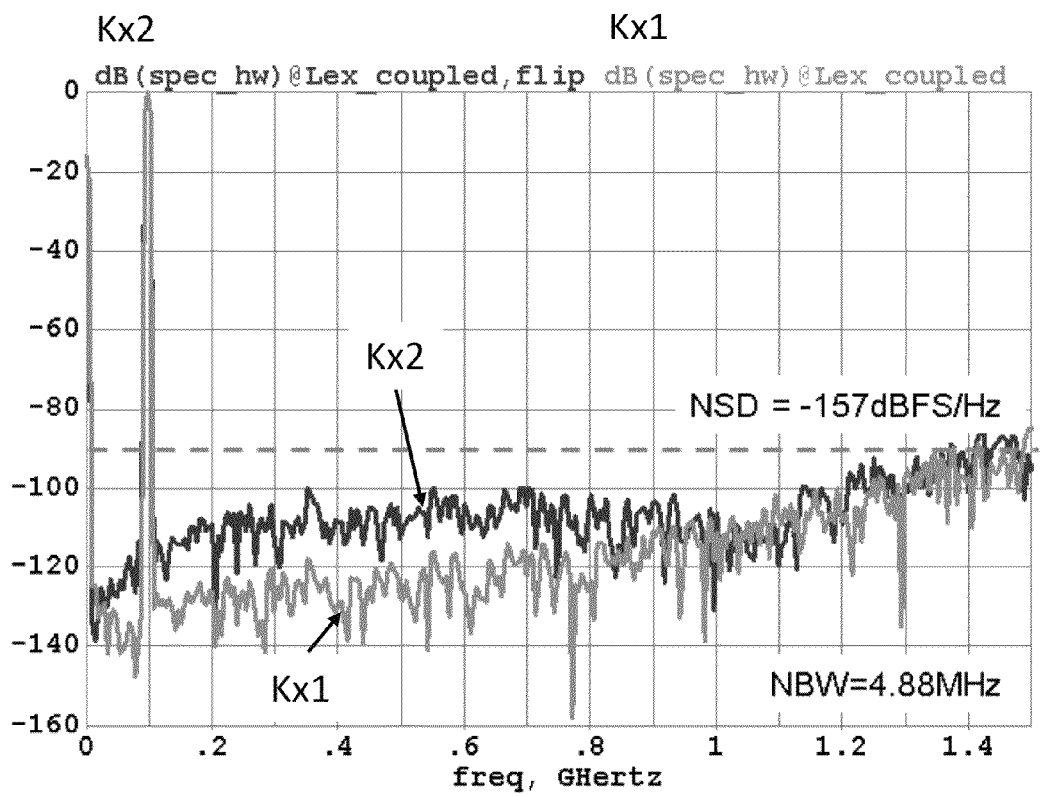
FIG. 16 shows a plot of simulated output spectrum of a continuous time pipeline analog-to-digital converter for planar inductors having 2 different magnetic flux patterns, according to some embodiments of the disclosure.

FIG. 16 shows a plot of simulated output spectrum of a continuous time pipeline analog-to-digital converter for planar inductors having 2 different magnetic flux patterns, according to some embodiments of the disclosure. In particular, FIG. 16 shows simulated CT pipeline ADC final output spectra with two different LC lattice inductor placements (magnetic flux patterns XOOX and XXXX). Again each CT pipeline ADC stage includes two cascaded LC lattice structures (having 4 inductors). The XOOX pattern based CT pipeline ADC gives a 15 dB lower noise floor compared to the one based on a XXXX pattern.

Alternative Continuous Time Delay Line

Broadly speaking, a delay line is used in a residual producing circuit (or some other circuit requiring a continuous time delay line) for delaying a differential analog input pair to provide a delayed differential analog input pair. The residual producing circuit may include an analog-to-digital converter (ADC) for converting the differential analog input pair into a differential digital output pair and a digital-to-analog converter (DAC) for converting the differential digital output pair to a filtered differential analog input pair. The residual signal is then produced from the delayed differential analog input signal pair and a filtered version of the differential analog input pair.

One example delay line implemented with continuous time components includes the LC lattice structure disclosed herein (e.g., as seen in FIG. 8, or in cascaded form as seen in FIG. 6). Another example of a delay line may include a transmission line. The transmission line comprises one or more of the following: micro-strip transmission line, coplanar-waveguide transmission line, and fully-shielded coaxial-like transmission line. Using transmission line based delay line is attractive for applications at microwave frequencies where the delay required is much smaller. For example, an ADC clocked at 40 GHz will have a clock period of 25 ps. So 1.5 clock periods is only 37.5 ps. This can be implemented by transmission line with a length less than 2 mm. However, a ADC clocked at 4 GHz will require 10 times the length which is too bulky for integrated circuit implementation.

Example Application: Continuous Time Delta-Sigma Multi-Stage Noise Shaping ADC

The (wideband) LC lattice delay line can also be used in CT MASH ADCs. A CT MASH ADC typically requires a residue producing circuit that subtracts an analog waveform (a delayed analog input signal) from its coarsely digitized waveform (the filtered version of the analog input signal). This coarse digitization can be performed by differential types of ADCs. The analog delay is crucial to balance the phase difference between the analog path and the digital path such that the residue is well bounded within the full scale of the back end ADC in a MASH.

Figure 17:
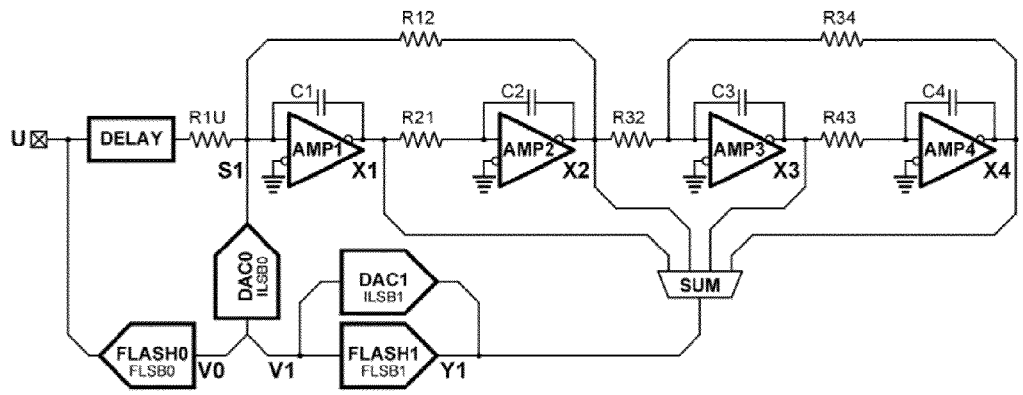
FIG. 17 shows a simplified schematic diagram of a 0-4 continuous time delta-sigma multi-stage noise shaping analog-to-digital converter with a continuous time delay line, according to some embodiments of the disclosure.

FIG. 17 shows a simplified schematic diagram of a 0-4 continuous time delta-sigma (DS) multi-stage noise shaping (MASH) analog-to-digital converter (ADC) with a continuous time (CT) delay line, according to some embodiments of the disclosure. In particular, FIG. 17 illustrates a 0-4 MASH CT ADC (having a Flash ADC in the first stage and a $4^{th}$ order DS modulator in the second stage). An analog delay line is added between its analog input U and DAC0 output. With the proper delay, the DAC0 output current can be subtracted from the delayed analog input signal current via R1U. The residue of the coarse quantization provided by the FLASH0 ADC is fed to the 4th order DS back end and gets digitized.

In this example, the CT delay line is connected between an input having the differential analog input and a summation node S2 having the filtered version of the differential analog input atpair. The differential analog input pair is digitized by a flash analog-to-digital converter (ADC). A digital differential output pair of the flash ADC is provided to a digital-to-analog converter DAC to produce the filtered version of the differential analog input pair.

Example Application: ZOOM Delta-Sigma Multi-Stage Noise Shaping ADC

Figure 18:
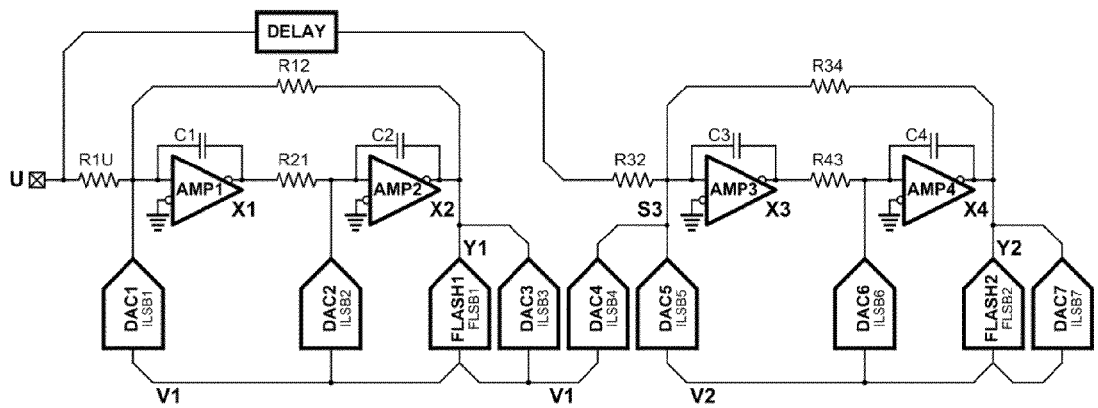
FIG. 18 shows a simplified schematic diagram of a 2-2 ZOOM delta-sigma multi-stage noise shaping analog to digital converter with a continuous time delay line, according to some embodiments of the disclosure.

FIG. 18 shows a simplified schematic diagram of a 2-2 ZOOM delta-sigma multi-stage noise shaping analog to digital converter with a continuous time delay line, according to some embodiments of the disclosure. The 2-2 Zoom MASH ADC is a special implementation of a MASH ADC. In particular, a full delta-sigma (DS) modulator is provided at the front-end of the MASH ADC, and another full DS modulator is provided at the back-end of the MASH ADC. The front-end DS modulator digitizes an analog input signal, and the back-end DS modulator digitizes an error between the output of the front-end $\Delta\Sigma$ modulator and the (original) analog input signal. In this configuration where the back-end modulator digitizes the error of the (full) front-end modulator, some design constraints of the front-end are relaxed. These design constraints include thermal noise, digital noise cancellation filter complexity (the quantization noise of the front-end is already shaped by the noise transfer function of the front-end), and/or non-linearity. An analog delay line is added between the analog input U and DAC4 output. The DAC4 output represents digitized output of the 2nd order DS front end. Thus, the delay provided by the delay line is the total delay through the front-end DS ADC. With proper delay, the residue of the entire front-end can be produced and digitized by the 2nd order DS back end.

In this example, the CT delay line is connected between an input U having the the differential analog input and a summation node S3 having the filtered version of the differential analog input pair. The differential analog input pair is digitized by a delta-sigma modulator/analog-to-digital converter (ADC). A digital differential output pair of the delta-sigma ADC is provided to a digital-to-analog converter DAC to produce the filtered version of the differential analog input pair.

Example Application: Traveling-Wave Circuit

Figure 19:
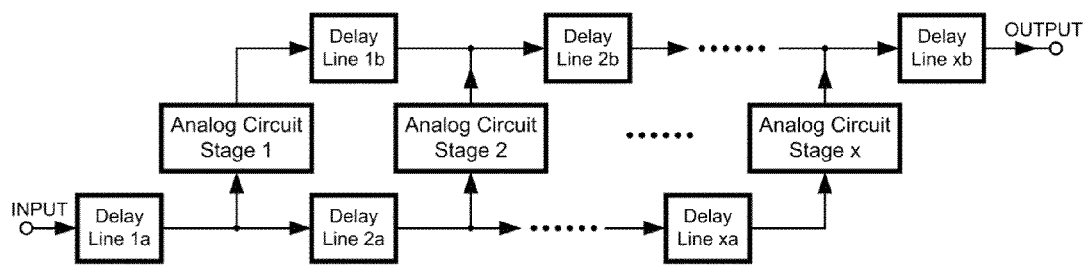
FIG. 19 shows a simplified schematic diagram of a traveling wave circuit with multiple continuous time delay lines, according to some embodiments of the disclosure.

FIG. 19 shows a simplified schematic diagram of a traveling wave circuit with multiple continuous time delay lines, according to some embodiments of the disclosure. In particular, FIG. 19 illustrates the use of LC lattice structure(s) as disclosed herein in a traveling-wave analog circuit. The input signal injected at the INPUT port on the left bottom travels through a few delay stages labeled as "Delay Line xa". After each input delay stage, the delayed input signal drives an analog circuit module labeled as "Analog Circuit Stage x". The output of the analog circuit module is then injected into an output delay line comprising of delay line segments labeled as "Delay Line xb". This technique is called traveling-wave circuits and useful for micro-wave frequency circuits such as traveling-wave amplifiers for signal frequencies above 40 GHz.

Further Embodiments of the Present Disclosure

In the discussions of the embodiments above, the capacitors, clocks, DFFs, dividers, inductors, resistors, amplifiers, switches, digital core, transistors, and/or other components can readily be replaced, substituted, or otherwise modified in order to accommodate particular circuitry needs. Moreover, it should be noted that the use of complementary electronic devices, hardware, software, etc. offer an equally viable option for implementing the teachings of the present disclosure.

In one example embodiment, any number of electrical circuits of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself.

In another example embodiment, the electrical circuits of the FIGURES may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the amplification functionalities may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

In certain contexts, the features discussed herein can be applicable to medical systems, scientific instrumentation, wireless and wired communications, radar, industrial process control, audio and video equipment, current sensing, instrumentation (which can be highly precise), and other systems utilizing analog-to-digital converters or systems involving delay lines. Moreover, certain embodiments discussed above can be provisioned in technologies for medical imaging, patient monitoring, medical instrumentation, and home healthcare. This could include pulmonary monitors, accelerometers, heart rate monitors, pacemakers, etc. Other applications can involve automotive technologies for safety systems (e.g., stability control systems, driver assistance systems, braking systems, infotainment and interior applications of any kind). Furthermore, powertrain systems (for example, in hybrid and electric vehicles) can use high-precision data conversion products in battery monitoring, control systems, reporting controls, maintenance activities, etc.

In yet other example scenarios, the teachings of the present disclosure can be applicable in the industrial markets that include process control systems that help drive productivity, energy efficiency, and reliability. In consumer applications, the teachings of the signal processing circuits discussed above can be used for image processing, auto focus, and image stabilization (e.g., for digital still cameras, camcorders, etc.). Other consumer applications can include audio and video processors for home theater systems, DVD recorders, and high-definition televisions. Yet other consumer applications can involve advanced touch screen controllers (e.g., for any type of portable media device). Hence, such technologies could readily part of smartphones, tablets, security systems, PCs, gaming technologies, virtual reality, simulation training, etc.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

OTHER NOTES, EXAMPLES, AND IMPLEMENTATIONS

Note that all optional features of the apparatus described above may also be implemented with respect to the method or process described herein and specifics in the examples may be used anywhere in one or more embodiments.

In a first example, a system is provided (that can include any suitable circuitry, dividers, capacitors, resistors, inductors, ADCs, DFFs, logic gates, software, hardware, links, etc.) that can be part of any type of computer, which can further include a circuit board coupled to a plurality of electronic components. The system can include means for clocking data from the digital core onto a first data output of a macro using a first clock, the first clock being a macro clock; means for clocking the data from the first data output of the macro into the physical interface using a second clock, the second clock being a physical interface clock; means for clocking a first reset signal from the digital core onto a reset output of the macro using the macro clock, the first reset signal output used as a second reset signal; means for sampling the second reset signal using a third clock, which provides a clock rate greater than the rate of the second clock, to generate a sampled reset signal; and means for resetting the second clock to a predetermined state in the physical interface in response to a transition of the sampled reset signal.

The 'means for' in these instances (above) can include (but is not limited to) using any suitable component discussed herein, along with any suitable software, circuitry, hub, computer code, logic, algorithms, hardware, controller, interface, link, bus, communication pathway, etc. In a second example, the system includes memory that further comprises machine-readable instructions that when executed cause the system to perform any of the activities discussed above.

What is claimed is:

1. A continuous time (CT) delay line for delaying a differential analog input pair in an analog-to-digital converter comprising a circuit producing a residual signal, the CT delay line comprising:
   two or more resonant (LC) lattice structures for generating a delayed differential analog input signal pair, each LC lattice structure comprising two inductive components and two capacitive components, wherein either (1) the two inductive components are cross coupled or (2) the two capacitive components are cross coupled; and
   wherein:
      the residual signal is produced from the delayed differential analog input signal pair and a filtered version of the differential analog input pair;
      the two or more LC lattice structures are cascaded in multiple stages; and
      resonant frequencies of the two or more LC lattice structures are placed at adjacent frequencies to provide group delay over a wide-band of frequencies of the differential analog input pair.

2. The CT delay line of claim 1, wherein:
   the inductive components has a inductance L, the capacitive components has a capacitance C, and the an analog-to-digital converter digitizing the differential analog input signal pair has a clock frequency of $f_{CK}$;
   L and C is determined according to the following, if the delay is matched to 1.5× the clock period of the ADC:

$$L = \frac{3Z_o}{4Nf_{CK}} \text{ and } C = \frac{3}{4NZ_o f_{CK}};$$

and
   N is the number of cascaded lattice structures in the CT delay line.

3. The CT delay line of claim 1, wherein:
   the CT delay line is connected between an input having the differential analog input pair and a summation node having the filtered version of the differential analog input pair;
   the differential analog input pair is digitized by a flash analog-to-digital converter (ADC); and
   a digital differential output pair of the flash ADC is provided to a digital-to-analog converter DAC to produce the filtered version of the differential analog input pair.

4. The CT delay line of claim 1, wherein:
the CT delay line is connected between an input having the differential analog input pair and a summation node having the filtered version of the differential analog input pair;
the differential analog input pair is digitized by a delta-sigma analog-to-digital converter (ADC); and
a digital differential output pair of the delta-sigma ADC is provided to a digital-to-analog converter DAC to produce the filtered version of the differential analog input pair.

5. A continuous time (CT) delay line for delaying a differential analog input pair in a circuit producing a residual signal, the CT delay line comprising:
one or more resonant (LC) lattice structures for generating a delayed differential analog input signal pair, each LC lattice structure comprising two inductive components and two capacitive components, wherein either (1) the two inductive components are cross coupled or (2) the two capacitive components are cross coupled; and
wherein:
the residual signal is produced from the delayed differential analog input signal pair and a filtered version of the differential analog input pair;
the inductive components has a inductance L, the capacitive components has a capacitance C, and the an analog-to-digital converter digitizing the differential analog input signal pair has a clock frequency of $f_{CK}$;
L and C is determined according to the following, if the delay is matched to 1.5× the clock period of the ADC:

$$L = \frac{3Z_o}{4Nf_{CK}} \text{ and } C = \frac{3}{4NZ_o f_{CK}};$$

and
wherein N is the number of cascaded lattice structures in the CT delay line.

6. A plurality of continuous time (CT) delay lines implemented in an integrated circuit chip, wherein each of the CT delay lines comprises:
one or more resonant (LC) lattice structures for delaying a differential analog input, wherein each of the LC lattice structures comprises two inductive components and two capacitive components;
wherein a magnetic flux pattern of the inductive components of the plurality of CT delay lines has a checkered pattern, when a differential alternating current (AC) signal is applied an input of each CT delay line, to reduce coupling between the inductive components in between the plurality of CT delay lines, said checkered pattern alternating a particular flux directionality of adjacent inductive components between (1) X=an inductive component having flux going from the substrate up towards the surface of the integrated circuit chip and (2) O=an inductive component having flux going from the surface of the integrated circuit chip towards the substrate of the integrated circuit chip.

7. The plurality of CT delay lines of claim 6, wherein:
two of the CT delay lines each comprises two cascaded lattice structures having two inductive components L1$p$, L1$n$ in a first lattice structure, and two inductive components L2$p$, and L2$n$ in a second lattice structure; and wherein L1$p$, L1$n$, L2$p$, and L2$n$ are spatially arranged as four planar inductors according to the following grid pattern:

| | |
|---|---|
| L1p | L2p |
| L1n | L2n. |

8. The plurality of CT delay lines of claim 7, wherein L1$p$ and L2$p$ are connected in series and L1$n$ and L2$n$ are connected in series.

9. The plurality of CT delay lines of claim 7, wherein:
the two of the CT delay lines each have a differential input port IN+, IN− and a differential output port OUT+, OUT−,
IN+ is connected to one terminal of L1$p$;
OUT+ is connected to one terminal of L2$p$;
IN− is connected to one terminal of L1$n$; and
OUT− is connected to one terminal of L2$n$.

10. The plurality of CT delay lines of claim 7, wherein the magnetic flux pattern follows one of the following:

| | |
|---|---|
| L1p = X | L2p = O |
| L1n = O | L2n = X |

Or

| | |
|---|---|
| L1p = O | L2p = X |
| L1n = X | L2n = O. |

11. The plurality of CT delay lines of claim 6, wherein the inductive components of the LC lattice structures are cross coupled.

12. The plurality of CT delay lines of claim 6, wherein the capacitive components of the LC lattice structures are cross coupled.

13. The plurality of CT delay lines of claim 6, wherein:
the delay lines are configured for delaying a differential analog input pair in a circuit producing a residual signal wherein the one or more LC lattice structures configured for generating a delayed differential analog input signal pair; and
the residual signal is produced from the delayed differential analog input signal pair and a filtered version of the differential analog input pair.

14. The plurality of CT delay lines of claim 13, wherein:
the one or more LC lattice structures comprises a plurality of LC lattice structures cascaded in multiple stages where each stage has a different resonant frequency to provide a wide-band delay over frequency.

15. The plurality of CT delay lines of claim 6, wherein:
the CT delay lines are connected between an input having the differential analog input pair and a summation node having the filtered version of the differential analog input pair;
the differential analog input pair is digitized by a flash analog-to-digital converter (ADC); and
a digital differential output pair of the flash ADC is provided to a digital-to-analog converter DAC to produce the filtered version of the differential analog input pair.

16. The plurality of CT delay lines of claim 6, wherein:
the CT delay lines are connected between an input having the differential analog input pair and a summation node having the filtered version of the differential analog input pair;

the differential analog input pair is digitized by a delta-sigma-analog-to-digital converter (ADC); and a digital differential output pair of the sigma-delta ADC is provided to a digital-to-analog converter DAC to produce the filtered version of the differential analog input pair.

17. The plurality of CT delay lines of claim 6, wherein, for at least one of the CT delay lines:

the inductive components has a inductance L, the capacitive components has a capacitance C, and the differential analog input is digitized by an analog-to-digital converter (ADC) having a clock frequency of $f_{CK}$;

L and C is determined according to the following, if the delay is matched to 1.5× the clock period of the ADC filtering analog differential analog input pair:

$$L = \frac{3Z_o}{4Nf_{CK}} \text{ and } C = \frac{3}{4NZ_o f_{CK}}$$

and

N is the number of cascaded lattice structures in the CT delay line.

18. A circuit comprising:

a continuous time (CT) delay line for delaying a differential analog input pair to provide a delayed differential analog input pair, wherein the CT delay line comprises two or more resonant (LC) lattice structures cascaded in multiple stages for generating a delayed differential analog input signal pair, each LC lattice structure comprises two inductive components and two capacitive components, and resonant frequencies of the two or more LC lattice structures being placed at adjacent frequencies to provide group delay over a wide-band of frequencies of the differential analog input pair;

a summation node for generating a residual signal based on the delayed differential analog input pair and a filtered version of the differential analog input pair; and a back-end continuous-time delta-sigma analog-to-digital converter for converting the residual signal into a digital output.

19. The circuit of claim 18, wherein for each LC lattice structure, either the inductive components are cross coupled or the capacitive components are cross coupled.

20. The circuit of claim 18, wherein the transmission line comprises one or more of the following: micro-strip transmission line, coplanar-waveguide transmission line, and fully-shielded coaxial-like transmission line.

21. The circuit of claim 18, wherein the filtered version of the differential analog input pair is generated by digitizing the differential analog input pair by a flash analog-to-digital converter and converting a digital differential output pair of the flash analog-to-digital converter to produce the filtered version of the differential analog input pair.

22. The circuit of claim 18, wherein:

the filtered version of the differential analog input pair is generated by digitizing the differential analog input pair by a front-end delta-sigma modulator to produce the filtered version of the differential analog input pair; and the residue signal is an error of the full front-end delta-sigma modulator.

* * * * *